US007948770B2

(12) United States Patent
Lin et al.

(10) Patent No.: US 7,948,770 B2
(45) Date of Patent: May 24, 2011

(54) AC_LED SYSTEM IN SINGLE CHIP WITH THREE METAL CONTACTS

(75) Inventors: Ming-Te Lin, Hsinchu Hsien (TW); Wen-Yung Yeh, Hsinchu (TW); Chia-Chang Kuo, Hsinchu (TW); Hsi-Hsuan Yen, Hsinchu (TW); Sheng-Pan Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 858 days.

(21) Appl. No.: 11/608,786

(22) Filed: Dec. 8, 2006

(65) Prior Publication Data

US 2007/0138495 A1 Jun. 21, 2007

(30) Foreign Application Priority Data

Dec. 9, 2005 (TW) ............................... 94143520 A
Dec. 8, 2006 (TW) ............................... 95146116 A

(51) Int. Cl.
*G11C 11/00* (2006.01)

(52) U.S. Cl. ........ 361/806; 361/807; 361/808; 361/760; 361/810

(58) Field of Classification Search .................. 361/760, 361/761, 767, 768, 777, 781, 806, 805, 807–810; 362/226, 227, 262, 238, 800, 249.01, 249.02, 362/249.06, 249.11, 249.13, 249.14, 249.15; 315/184–185 R; 257/88–99, 82, 164
See application file for complete search history.

(56) References Cited

U.S. PATENT DOCUMENTS

| | | | | | |
|---|---|---|---|---|---|
| 4,367,471 | A | * | 1/1983 | Gillessen | 345/82 |
| 4,529,926 | A | * | 7/1985 | Takada | 523/210 |
| 5,936,599 | A | * | 8/1999 | Reymond | |
| 6,069,452 | A | * | 5/2000 | Rossner | 315/192 |
| 2004/0075399 | A1 | * | 4/2004 | Hall | 315/291 |
| 2004/0095099 | A1 | * | 5/2004 | Salama | |
| 2005/0200295 | A1 | * | 9/2005 | Lim et al. | |
| 2005/0253151 | A1 | * | 11/2005 | Sakai et al. | 257/79 |
| 2005/0270776 | A1 | * | 12/2005 | Allen et al. | |
| 2006/0044864 | A1 | * | 3/2006 | Lin et al. | 365/151 |

FOREIGN PATENT DOCUMENTS

| | | | |
|---|---|---|---|
| CN | 2754308 | | 1/2006 |
| CN | 1757267 | | 4/2006 |
| JP | 56137385 | | 10/1981 |
| JP | 03027058 | | 3/1991 |
| JP | 09139524 | | 5/1997 |
| JP | 2000101136 | | 4/2000 |
| JP | 2004193502 | | 7/2004 |
| WO | 2005101514 | * | 10/2005 |

OTHER PUBLICATIONS

"2nd Office Action of China Counterpart Application", issued on Nov. 13, 2009, p. 1-p. 11.
"Office Action of Taiwan Counterpart Application", issued on Jul. 16, 2010, p. 1-p. 9, in which the listed references were cited.
"Office Action of Japan Counterpart Application", issued on Sep. 28, 2010, p. 1-p. 2, in which the listed references were cited.

* cited by examiner

*Primary Examiner* — Dameon E Levi
*Assistant Examiner* — Hoa C Nguyen
(74) *Attorney, Agent, or Firm* — Jianq Chyun IP Office

(57) ABSTRACT

A plurality of AC_LED units are coupled and disposed on a single chip to form an AC_LED system in single chip with three metal contacts to be driven by three-phase voltage sources. Alternatively, an AC_LED system in single chip with four metal contacts is also disclosed to be driven by four-phase voltage sources.

5 Claims, 16 Drawing Sheets

AC_LED SYSTEM IN SINGLE CHIP WITH THREE METAL CONTACTS

FIELD OF THE INVENTION

The present invention relates to a plurality AC_LED disposed and coupled in a single chip to form an AC_LED system. Especially, the present invention discloses an AC_LED system in a single chip with three metal contacts to be driven by three-phase voltage power source.

BACKGROUND OF THE INVENTION

FIG. 1 is a prior art of US2005/0253151 publication that discloses an AC_LED operating on a high drive voltage formed on an insulating substrate 10. A plurality of DC_LED 1 are connected in series to form an LED array. Air-bridge wiring 28 is formed between the LED units 1, and between the LED units 1 and electrode power pads 32. Two LED arrays are connected in inverse parallel, and therefore an AC power supply can be used as the power supply. Traditional three-dimension interconnection is used to avoid circuit short in between wiring 28 on the same plane as shown in the cross section 34. The two electrode power pads 32 is to couple to a single-phase voltage power source. This kind of AC_LED system is unable to be driven by a three-phase voltage power source.

SUMMARY OF THE INVENTION

In accordance with the foregoing drawbacks in the prior art, a primary objective of the present invention is to produce an AC_LED system in a single chip with three metal contacts that can be driven by a three-phase voltage power source.

DETAILED DESCRIPTION OF THE PREFERRED EMBODIMENTS

A plurality of AC_LED units are integrated and disposed on a same semiconductor chip to form a single chip AC_LED lighting system with three metal contacts to couple to a three-phase voltage power source for controlling the light timing of the AC_LED lighting system. The circuitry of one of the embodiment is equivalent to a triangle connection with three series of AC_LED units. Alternatively, a single chip design equivalent to Y-shape circuitry is also disclosed for coupling to a four-phase voltage power source.

Figure 1:
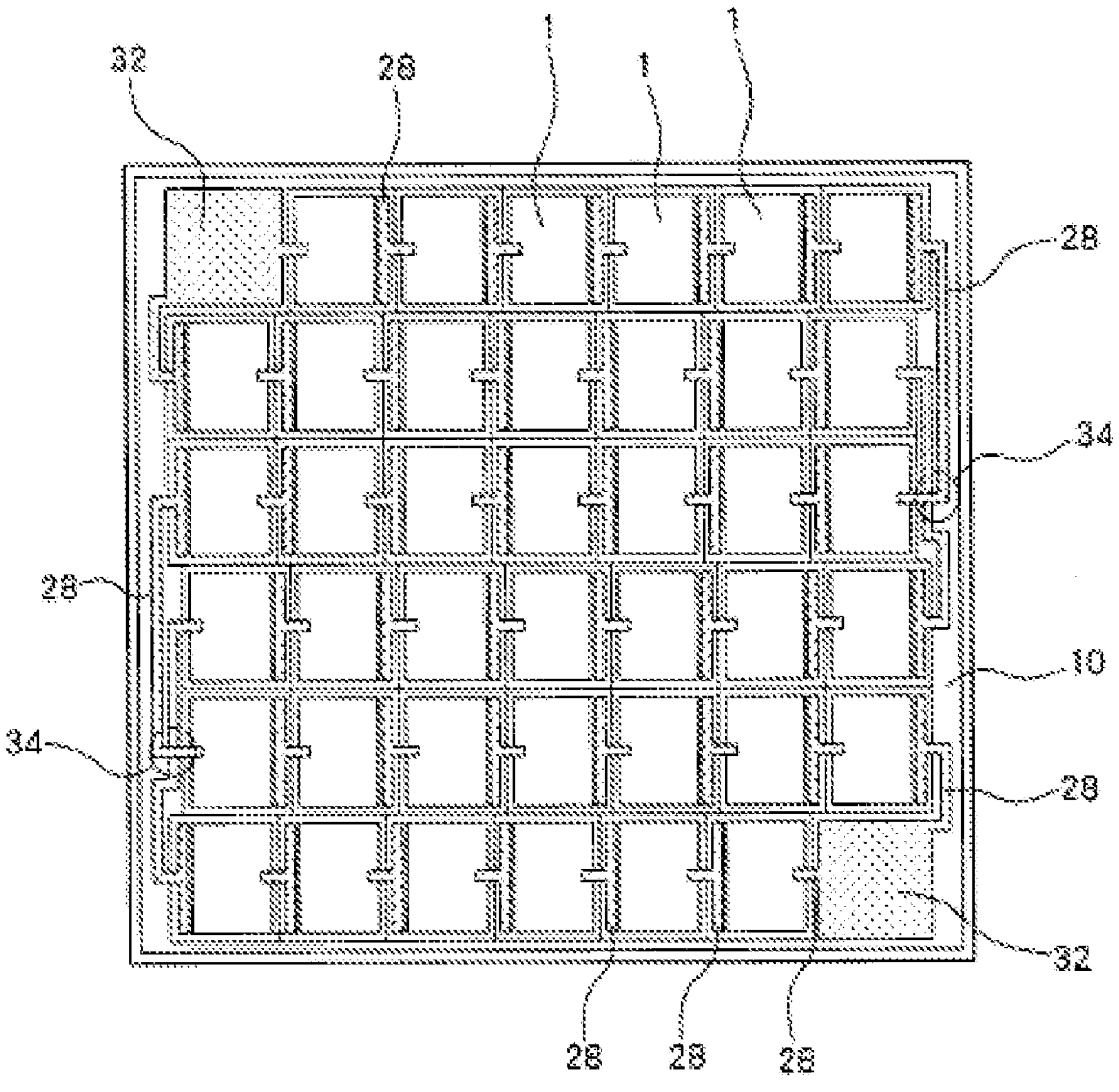
Fig. 1. Prior Art
FIG. 1. is a schematic view showing the prior art of US2005/0253151.
Figure 2A:
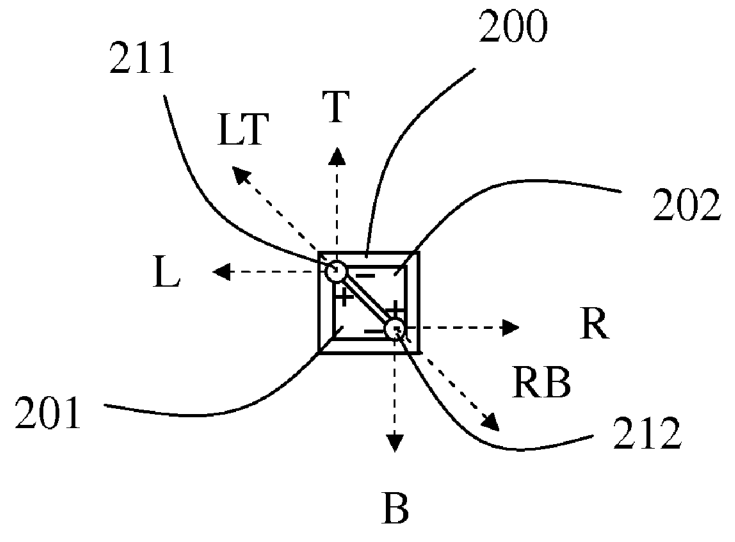
FIG. 2A is a schematic view showing a first basic unit used in the present invention.

Referring to FIG. 2A, which is a schematic view showing a first basic unit used in the present invention, an AC_LED unit used in the present invention comprises a complementary pair of triangle DC_LED units, namely a first DC_LED 201 disposed on an insulating substrate 200, and a second DC_LED 202 disposed on the same insulating substrate 200. The first DC_LED 201 has a positive electrode on the upper left corner and a negative electrode on the lower right corner. The second DC_LED 202 has a positive electrode disposed on its lower right corner and a negative electrode on its upper left corner; in other words, the two electrodes of DC_LED 201 and DC_LED 202 are position complementarily arranged so as to form an AC_LED unit with a shortest electrical coupling with each other in between the two LED units. The basic AC_LED unit of FIG. 2A is equivalent to the circuit design in FIG. 3.

A first metal contact 211 is disposed on the upper left corner of the AC_LED unit for coupling the positive electrode of the first DC_LED 201 and the negative electrode of the second DC_LED 202. The metal contact 211 allows the AC_LED unit to couple to a top AC_LED unit (not shown) with a shortest electrical coupling as indicated by arrow T, allows the AC_LED unit to couple to a left AC_LED unit (not shown) with a shortest electrical coupling as indicated by arrow L, and allows the AC_LED unit to couple to a upper left AC_LED unit (not shown) with a shortest electrical coupling as indicated by arrow LT.

A second metal contact 212 is disposed on the lower right corner of the AC_LED unit for coupling the negative electrode of the first DC_LED 201 and the positive electrode of the second DC_LED 202. The second metal contact allows the AC_LED unit to couple to a right AC_LED unit (not shown) with a shortest electrical coupling as indicated by arrow R, and allows to couple the AC_LED unit to a bottom AC_LED unit (not shown) with a shortest electrical coupling as indicated by arrow B, and allows to couple the AC_LED unit to a lower right AC_LED unit (not shown) with a shortest electrical coupling as indicated by arrow RB.

Figure 2B:
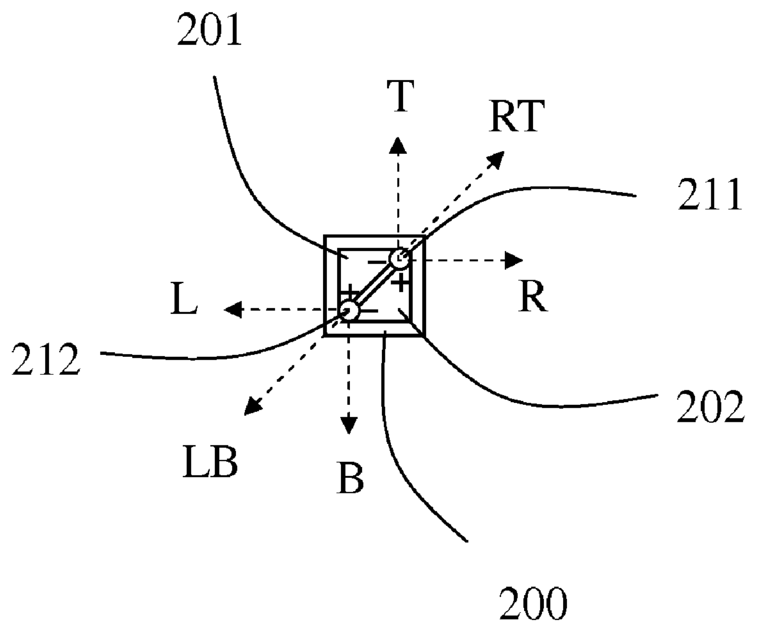
FIG. 2B is a schematic view showing a second basic unit used in the present invention.

Referring to FIG. 2B, which is a schematic view showing a second basic unit used in the present invention, an AC_LED used in the present invention comprises a complementary pair of triangle DC_LED units, namely a first LED 201 disposed on an insulating substrate 200, and a second LED 202 disposed on the same insulating substrate 200. The first LED 201 has a positive electrode on the upper right corner, and a negative electrode on the lower left corner. The second DC_LED 202 has a positive electrode disposed on its lower left corner and a negative electrode on its upper right corner;

in other words, the two electrodes of DC_LED 201 and DC_LED 202 are position complementarily arranged so as to form an AC_LED unit with a shortest electrical coupling in between the two DC_LED units. The AC_LED basic unit of FIG. 2B is equivalent to the circuit design in FIG. 3.

A first metal contact 211 is disposed on the upper right corner of the AC_LED unit for coupling the negative electrode of the first DC_LED 201 and the negative positive electrode of the second DC_LED 202. The metal contact 211 allows the AC_LED unit to couple to a top AC_LED unit (not shown) with a shortest electrical coupling as indicated by arrow T, allows the AC_LED unit to couple to a right AC_LED unit (not shown) with a shortest electrical coupling as indicated by arrow R, and allows the AC_LED unit to couple to a upper right AC_LED unit (not shown) with a shortest electrical coupling as indicated by arrow RT.

A second metal contact 212 is disposed on the lower left corner of the AC_LED unit for coupling the positive electrode of the first DC_LED 201 and the positive negative electrode of the second DC_LED 202. The second metal contact allows the AC_LED unit to be coupled to a left AC_LED unit (not shown) with a shortest electrical coupling as indicated by arrow L, allows the AC_LED unit to be coupled to a bottom AC_LED unit (not shown) with a shortest electrical coupling as indicated by arrow B, and allows the AC_LED unit to be coupled to a lower left AC_LED unit (not shown) with a shortest electrical coupling as indicated by arrow LB.

Figure 3:
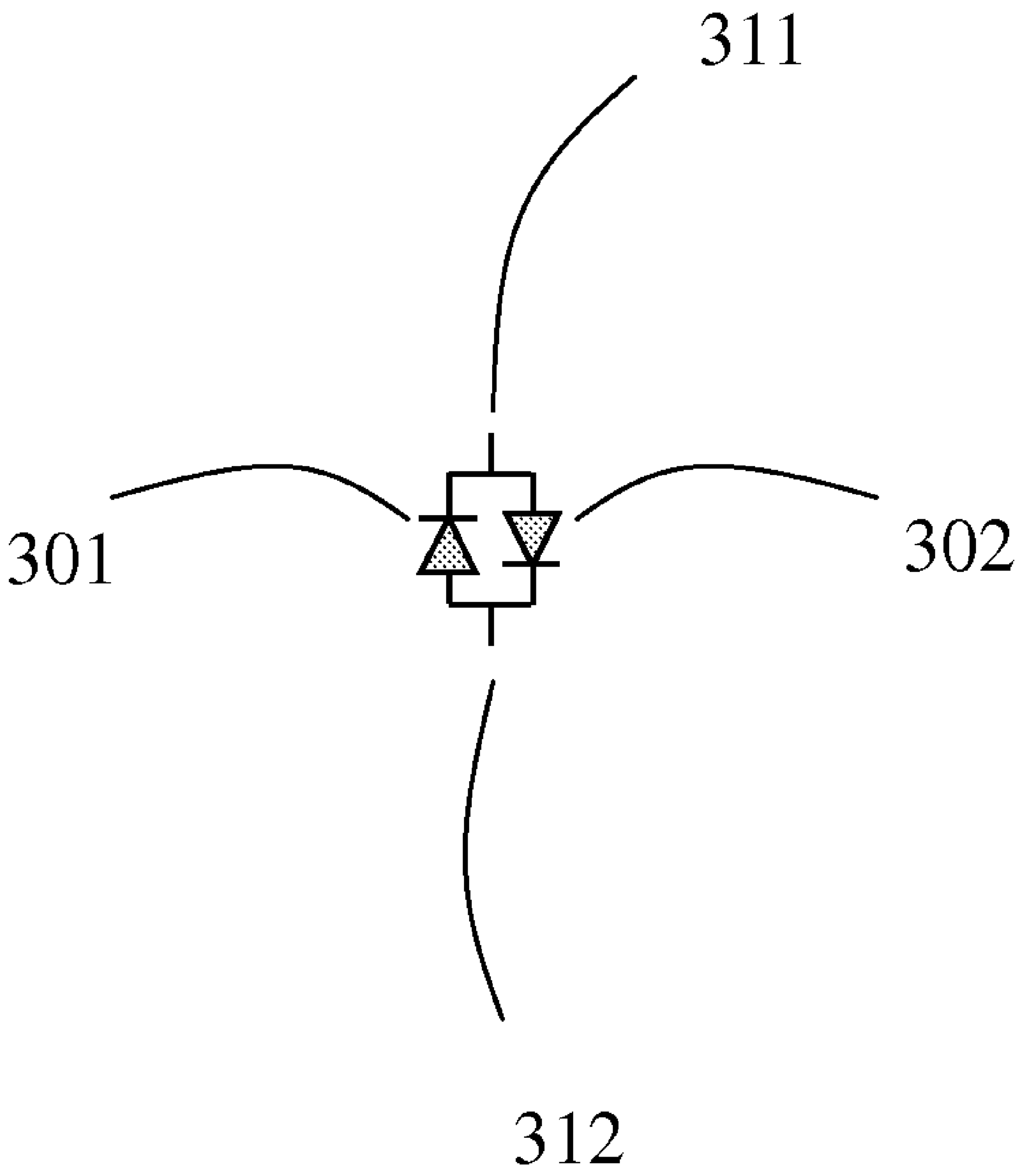
FIG. 3 is a schematic view showing an equivalent circuitry of the unit shown in FIG. 2A and FIG. 2B.

Referring to FIG. 3, which is a schematic view showing an equivalent circuitry of FIG. 2A and FIG. 2B, the first DC_LED 201 in either FIG. 2A or FIG. 2B is equivalent to the first DC_LED 301 in FIG. 3, and the second DC_LED 202 in either FIG. 2A or FIG. 2B is equivalent to the second DC_LED 302 in FIG. 3. The first metal contact 211 in either FIG. 2A or FIG. 2B is equivalent to the first metal line 311 in FIG. 3, and the second metal contact 212 in either FIG. 2A or FIG. 2B is equivalent to the second metal line 312 in FIG. 3. The first DC_LED 301 and the second DC_LED 302 are reversed parallel connection to form an AC_LED unit.

Figure 4A:
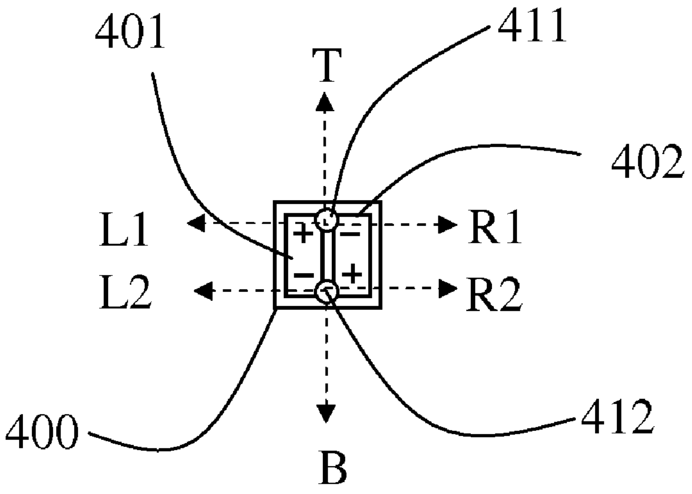
FIG. 4A is a schematic view showing a third basic unit used in the present invention.

Referring to FIG. 4A, which is a schematic view showing a third basic unit used in the present invention, an AC_LED unit used in the present invention comprises a complementary pair of rectangle DC_LED units, namely a first DC_LED 401 disposed on an insulating substrate 400, and a second DC_LED 402 disposed on the same insulating substrate 400. The first DC_LED 401 has a positive electrode on its top end, and a negative electrode on its bottom end. The second DC_LED 402 has a positive electrode disposed on its bottom end and a negative electrode on its top end. In other words, the two electrodes of DC_LED 401 and DC_LED 402 are position complementarily arranged so as to form an AC_LED unit with a shortest electrical coupling in between the two DC_LED units. The AC_LED basic unit of FIG. 4A is equivalent to the circuit design in FIG. 3.

A first metal contact 411 is disposed on the top end of the AC_LED unit for coupling the positive electrode of the first DC_LED 401 and the negative electrode of the second DC_LED 402. The metal contact 411 allows the AC_LED unit to be coupled to a top AC_LED unit (not shown) with a shortest electrical coupling as indicated by arrow T, allows the AC_LED unit to be coupled to a right AC_LED unit (not shown) with a shortest electrical coupling as indicated by arrow R1, and allows the AC_LED unit to be coupled to a left AC_LED unit (not shown) with a shortest electrical coupling as indicated by arrow L1.

A second metal contact 412 is disposed on the bottom end of the AC_LED unit for coupling the negative electrode of the first DC_LED 401 and the positive electrode of the second DC_LED 402. The second metal contact 412 allows the AC_LED unit to be coupled to a right AC_LED unit (not shown) with a shortest electrical coupling as indicated by arrow R2, allows the AC_LED unit to be coupled to a left AC_LED unit (not shown) with a shortest electrical coupling as indicated by arrow L2, and allows the AC_LED unit to be coupled to a bottom AC_LED unit (not shown) with a shortest electrical coupling as indicated by arrow B.

Figure 4B:
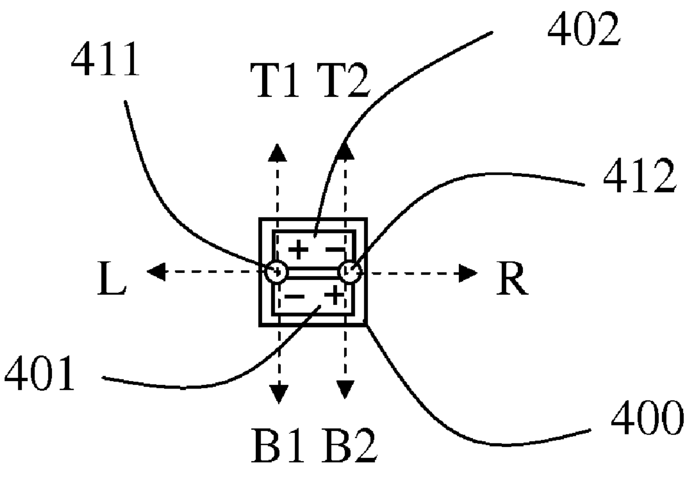
FIG. 4B is a schematic view showing a fourth basic unit used in the present invention.

Referring to FIG. 4B, which is a schematic view showing a fourth basic unit used in the present invention, an AC_LED unit used in the present invention comprises a complementary pair of rectangle DC_LED units, a first DC_LED 401 is disposed on an insulating substrate 400, a second DC_LED 402 is also disposed on the same insulating substrate 400. The first DC_LED 401 has a positive electrode on its right end, and a negative electrode on its left end. The second DC_LED 402 has a positive electrode disposed on its left end, and a negative electrode on its right end. i.e., the two electrodes of DC_LED 401 and DC_LED 402 are position complementarily arranged so as to form an AC_LED unit with a shortest electrical coupling in between the two DC_LED units. The basic unit of FIG. 4B is equivalent to the circuit design in FIG. 3.

A first metal contact 411 is disposed on the left end of the AC_LED unit for coupling the negative electrode of the first DC_LED 401 and the positive electrode of the second DC_LED 402. The metal contact 411 allows the AC_LED unit to couple to a top AC_LED unit (not shown) with a shortest electrical coupling as indicated by arrow T1, and allows the AC_LED unit to couple to a left AC_LED unit (not shown) with a shortest electrical coupling as indicated by arrow L, and allows the AC_LED unit to couple to a bottom AC_LED unit (not shown) with a shortest electrical coupling as indicated by arrow B1.

A second metal contact 412 is disposed on the right end of the AC_LED unit for coupling the positive electrode of the first DC_LED 401 and the negative electrode of the second DC_LED 402. The second metal contact 412 allows to couple the AC_LED unit to a top AC_LED unit (not shown) with a shortest electrical coupling as indicated by arrow T2, and allows the AC_LED unit to couple to a right AC_LED unit (not shown) with a shortest electrical coupling as indicated by arrow R, and allows to couple the AC_LED unit to a bottom AC_LED unit (not shown) with a shortest electrical coupling as indicated by arrow B2.

Figure 5:
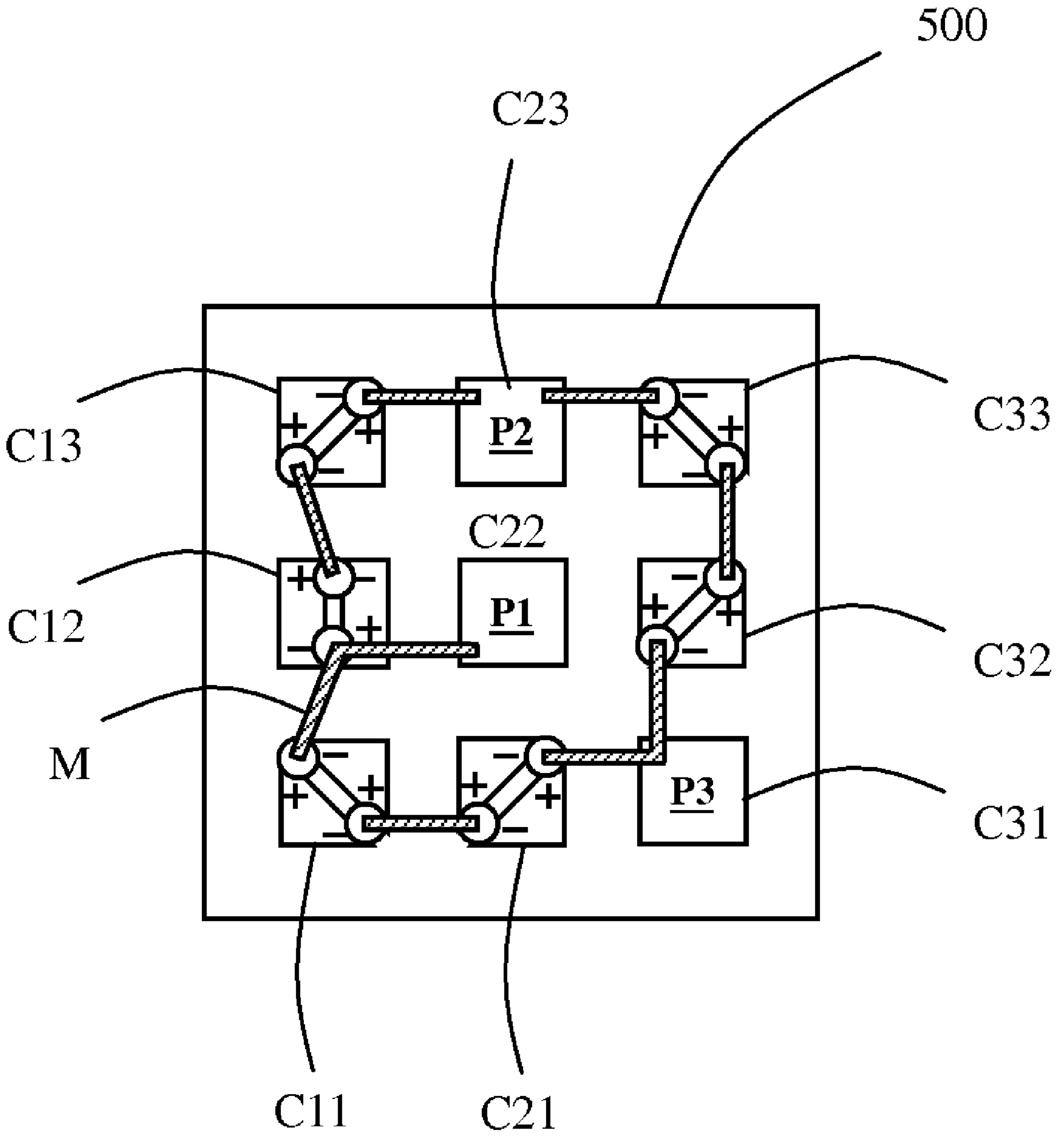
FIG. 5 is a schematic view showing a first embodiment of the present invention.

Referring to FIG. 5, which is a schematic view showing a first embodiment of the present invention, an AC_LED system in a single chip with three metal contacts or pads is disclosed. Six AC_LED units C11, C21, C12, C32, C13, C33 are disposed on a same substrate 500 as shown in the figure, a first metal contact P1 locates at area C22, a second metal contact P2 locates at area C23, and a third metal contact P3 locates at area C31. All the three metal contacts P1~P3 are also disposed on the same substrate 500.

A first series of AC_LED units has a first end coupled to the metal contact P1 and a second end coupled to the metal contact P2, metal line M is used to couple the circuit in between two neighboring AC_LED units. AC_LED C12, C13 are series connection in between metal contact P1 and metal contact P2.

A second series of AC_LED units has a first end coupled to the metal contact P1 and a second end coupled to the metal contact P3, metal line M is used to couple the circuit in between two neighboring AC_LED units. AC_LED C11, C21 are series connection in between metal contact P1 and metal contact P3.

A third series of AC_LED units has a first end coupled to the metal contact P2 and a second end coupled to the metal contact P3, metal line M is used to couple the circuit in between two neighboring AC_LED units. AC_LED C33, C32 are series connection in between metal contact P2 and metal contact P3.

Figure 6:
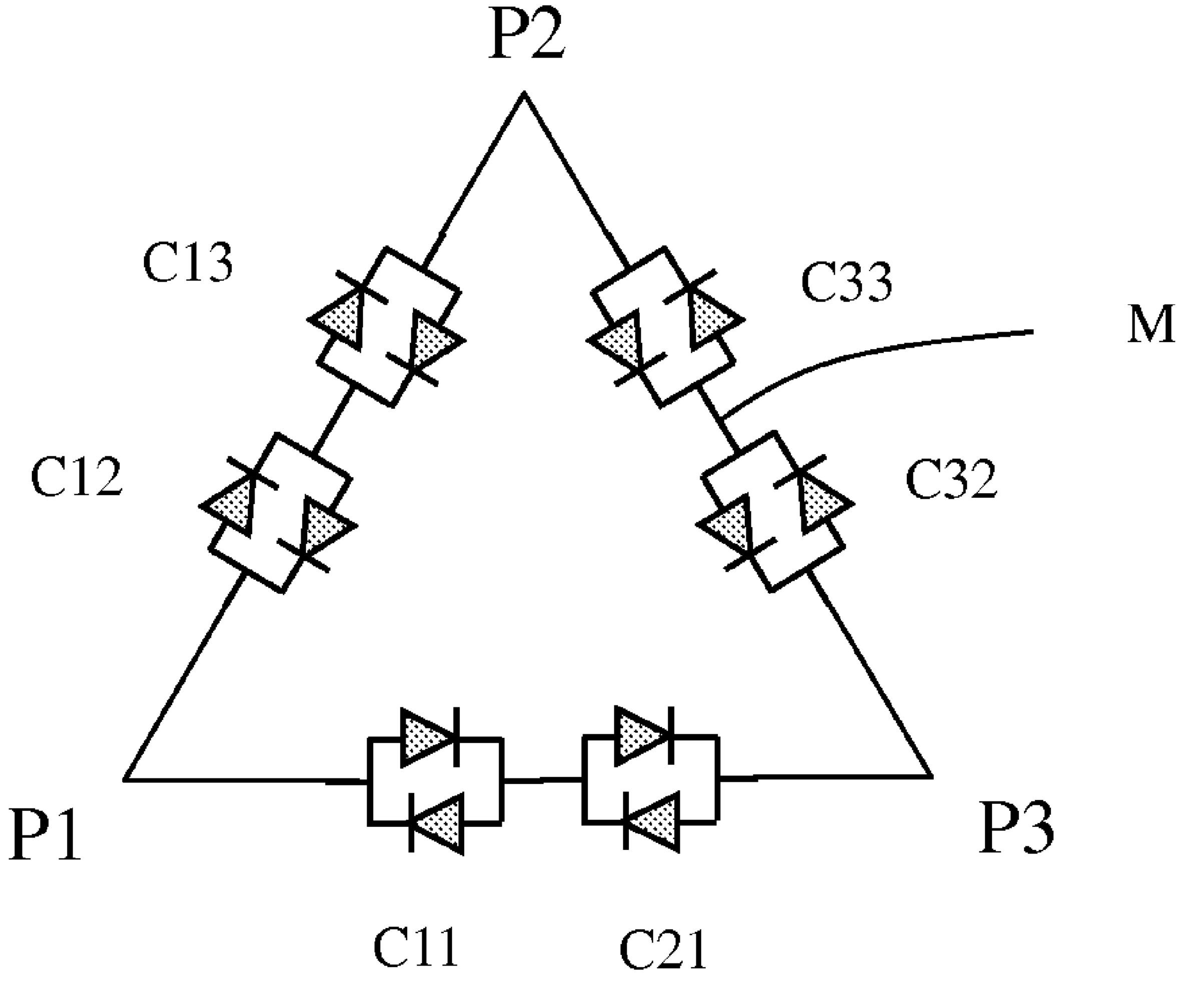
FIG. 6 is a schematic view showing an equivalent circuitry of FIG. 5.

Referring to FIG. 6, which is a schematic view showing an equivalent circuitry of FIG. 5, the six AC_LED units C11, C21, C12, C32, C13, C33 and the three metal contacts P1~P3 in FIG. 6 are corresponding to those in FIG. 5 respectively.

As shown in FIG. 6, AC_LED units C12 and C13 are in series connection in between metal contacts P1 and P2; AC_LED units C11 and C21 are in series connection in between metal contacts P1 and P3; AC_LED units C33 and C32 are in series connection in between metal contacts P2 and P3. The three metal contacts P1~P3 of the triangle circuitry are then coupled to a three-phase voltage power source.

Figure 7:
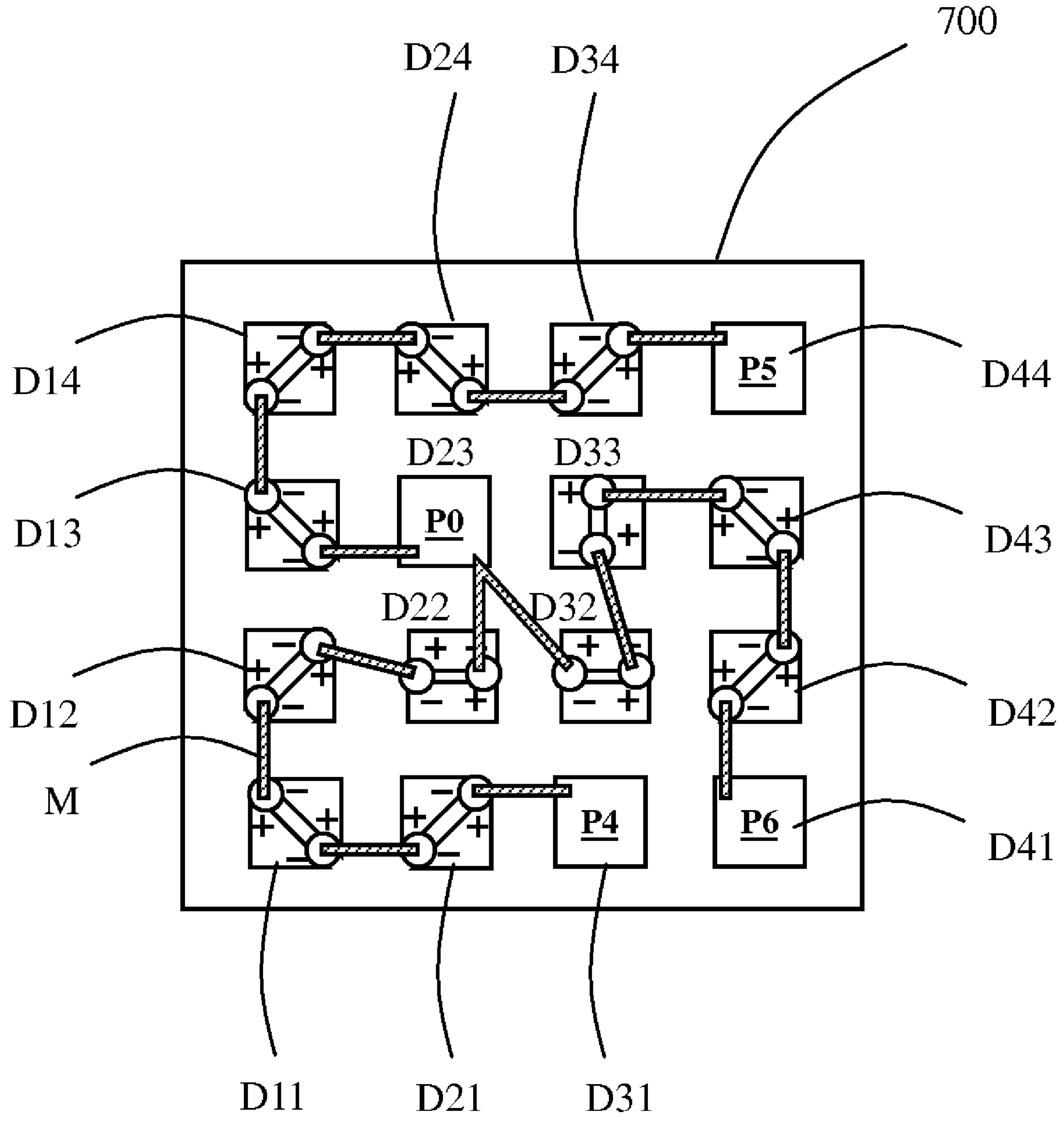
FIG. 7. is a schematic view showing a second embodiment of the present invention.

Referring to FIG. 7, which is a schematic view showing a second embodiment of the present invention, an AC_LED system in a single chip with four metal contacts or pads is disclosed. Twelve AC_LED units D11, D21, D12, D22, D32, D42, D13, D33, D43, D14, D24, D34 are disposed on a same substrate 700 as shown in the figure, a first metal contact P0 locates at area D23, a second metal contact P4 locates at area D31, a third metal contact P5 locates at area D44, and a fourth metal contact P6 locates at area D41. All the four metal contacts P0, P4~P6 are disposed on the same substrate 700.

A first series of AC_LED units has a first end coupled to the metal contact P0 and a second end coupled to the metal contact P4, metal line M is used to couple the circuit in between two neighboring AC_LED units. AC_LED D22, D12, D11, D21 are series connection in between metal contact P0 and metal contact P4.

A second series of AC_LED units has a first end coupled to the metal contact P0 and a second end coupled to the metal contact P5, metal line M is used to couple the circuit in between two neighboring AC_LED units. AC_LED D13, D14, D24, D34 are series connection in between metal contact P0 and metal contact P5.

A third series of AC_LED units has a first end coupled to the metal contact P0 and a second end coupled to the metal contact P6, metal line M is used to couple the circuit in between two neighboring AC_LED units. AC_LED D32, D33, D43, D42 are series connection in between metal contact P0 and metal contact P6. The four metal contacts P0, P4~P6 are then coupled to a four-phase voltage power source.

Figure 8:
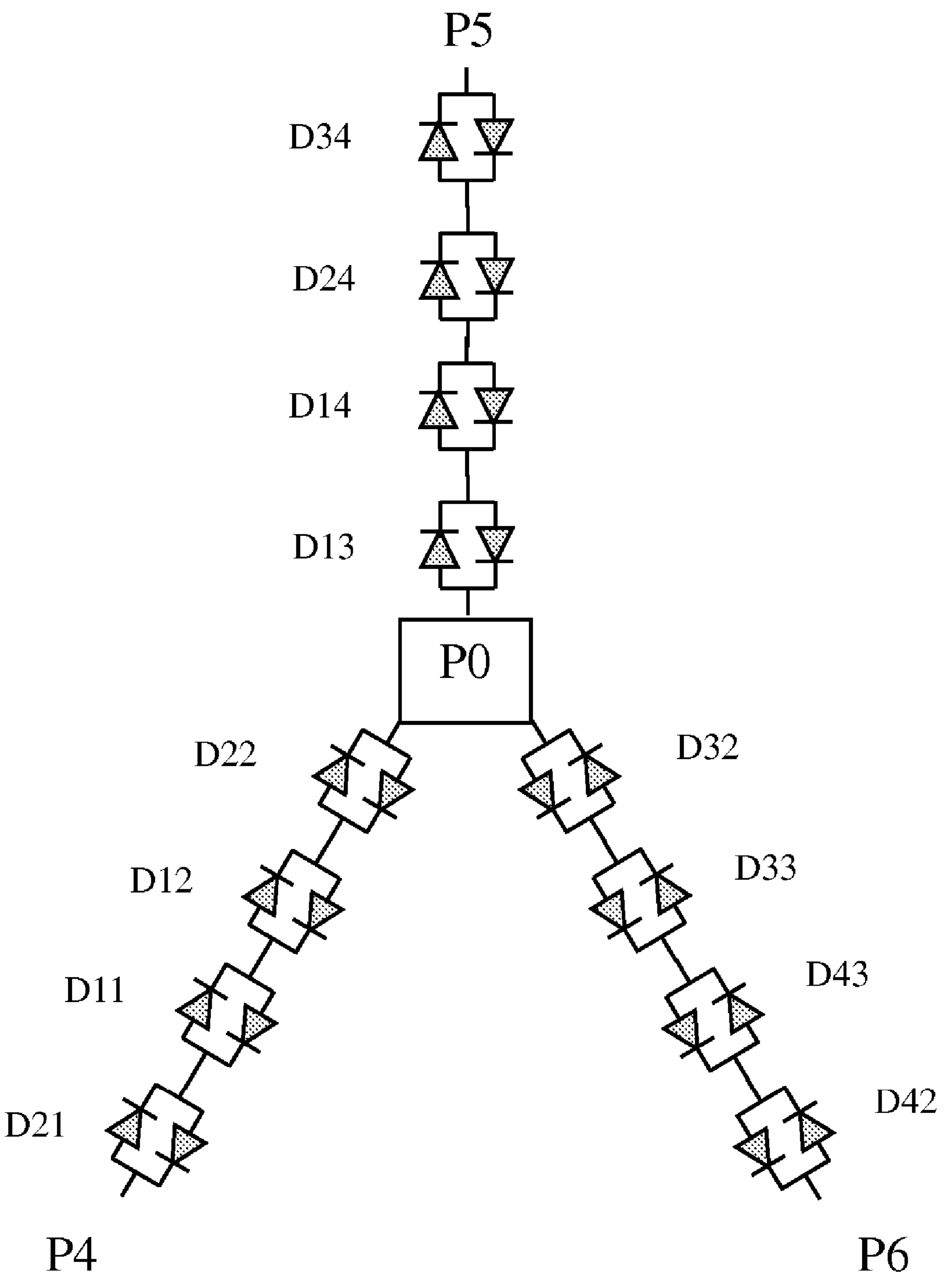
FIG. 8 is a schematic view showing an equivalent circuitry of FIG. 7.

Referring to FIG. 8, which is a schematic view showing an equivalent circuitry of FIG. 7, the twelve AC_LED units D11, D21, D12, D22, D32, D42, D13, D33, D43, D14, D24, D34, the metal contact P0, and the three metal contacts P4~P6 in FIG. 8 are corresponding to those in FIG. 7 respectively.

Referring to FIG. 8, which shows a Y-shape circuitry comprising three series of AC_LED units, the AC_LED units D21, D11, D12, D22 are in series connection in between metal contacts P0 and P4; AC_LED units D13, D14, D24, D34 are in series connection in between metal contacts P0 and P5; AC_LED units D32, D33, D43, D42 are in series connection in between metal contacts P0 and P6. The metal contact P0 and three metal contacts P4~P6 of the circuitry are then coupled to a four-phase voltage power source.

Figure 9:
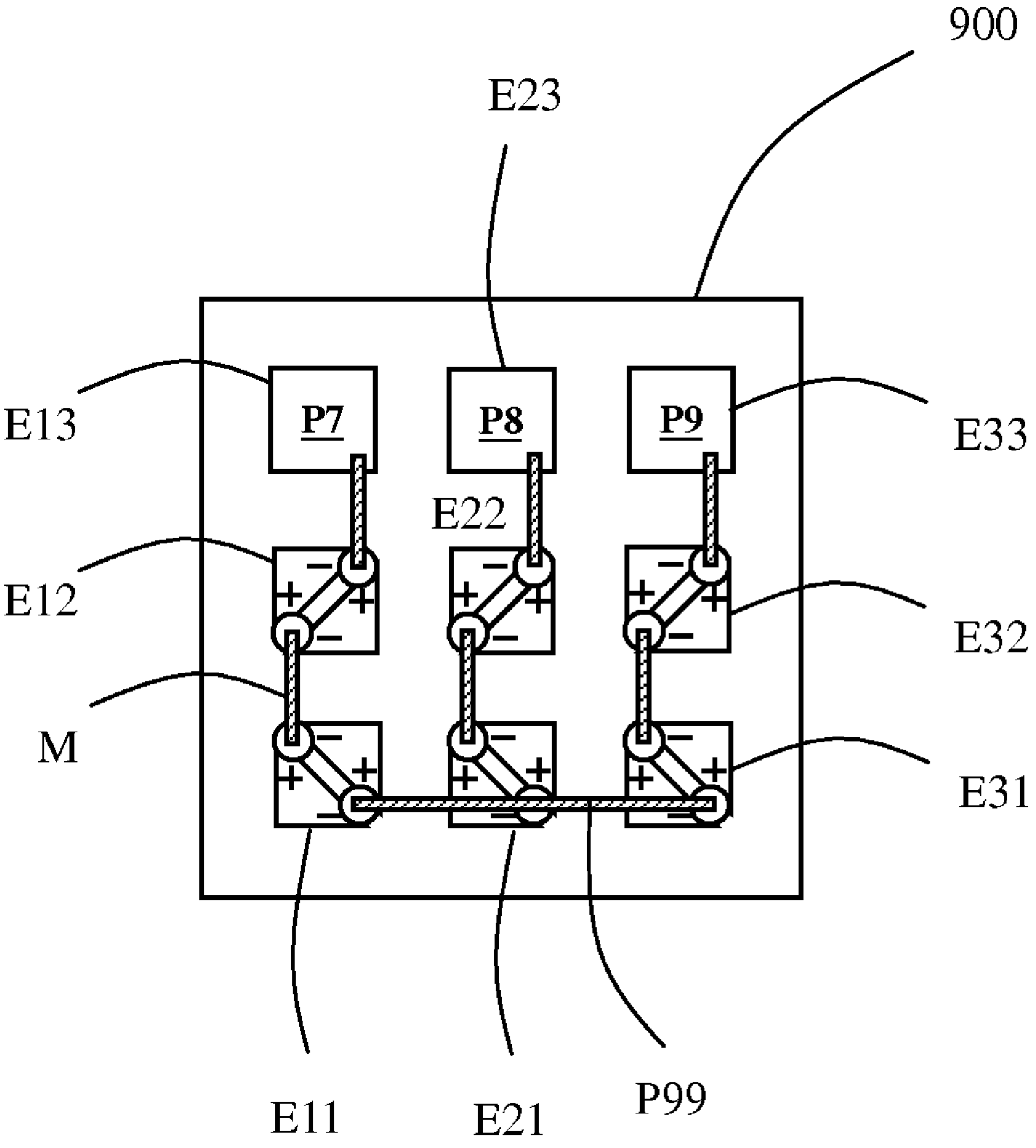
FIG. 9. is a schematic view showing a third embodiment of the present invention.

Referring to FIG. 9, which is a schematic view showing a third embodiment of the present invention, an AC_LED system in a single chip with three metal contacts or pads is disclosed. Six AC_LED units E11, E21, E31, E12, E22, E32 are disposed on a same substrate 900 as shown in the figure, a first metal contact P7 locates at area E13, a second metal contact P8 locates at area E23, a third metal contact P9 locates at area E33. A first series of AC_LED units E11, E12, a second series of AC_LED units E21, E22, and a third series of AC_LED units E31, E32 have their first end couple together with metal P99. The first series of AC_LED units couples its second end to the first metal contact P7. The second series of AC_LED units couples its second end to the second metal contact P8. The third series of AC_LED units couples its second end to the third metal contact P9. The three metal contacts P7~P9 are then coupled to a three-phase voltage power source.

Figure 10:
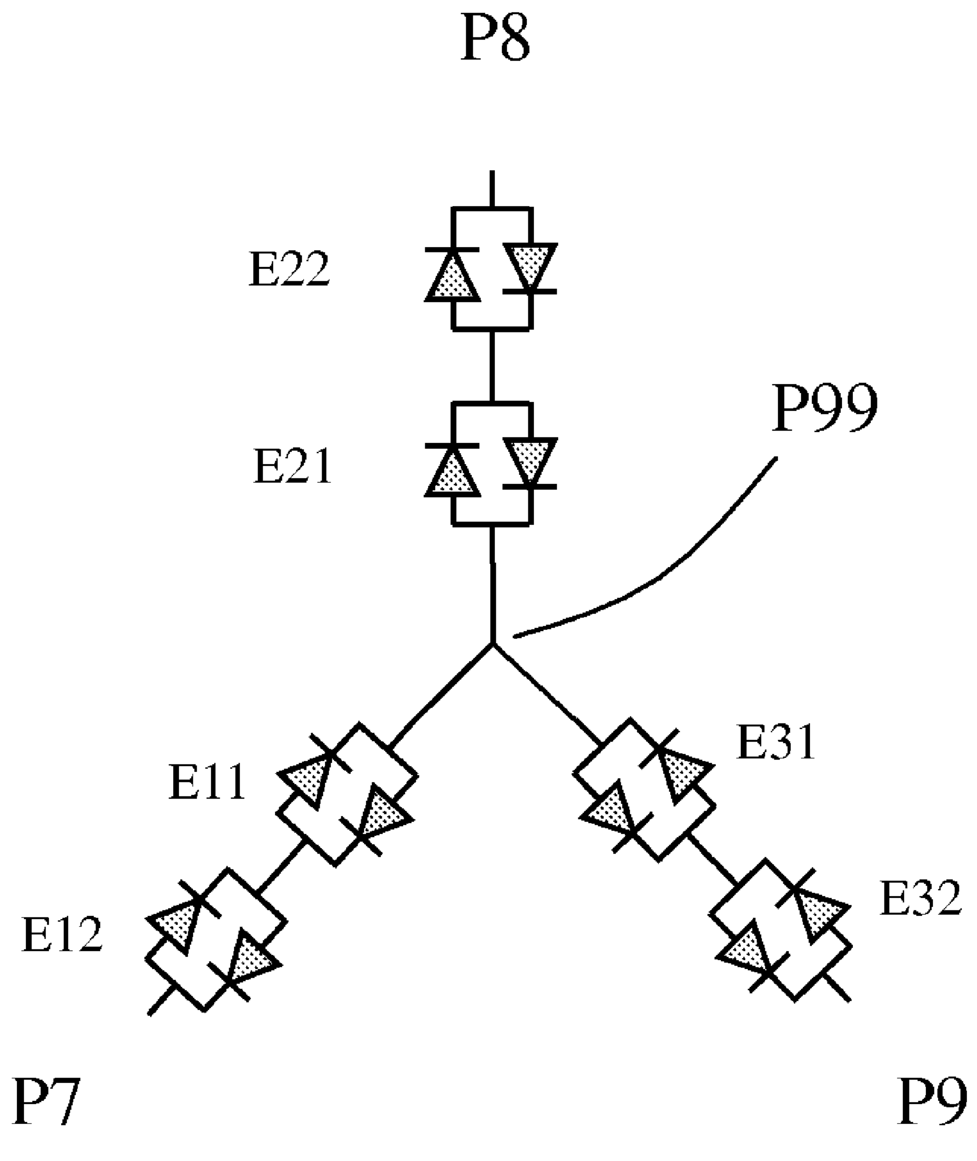
FIG. 10 is a schematic view showing an equivalent circuitry of FIG. 9.

Referring to FIG. 10, which is a schematic view showing an equivalent circuitry of FIG. 9, the six AC_LED units E11, E21, E31, E12, E22, E32, the metal contact P99, and the three metal contacts P7~P9 in FIG. 10 are corresponding to those in FIG. 9 respectively. The Y shape circuitry has a metal contact P99 coupling to all the first ends of the three series AC_LED units. The second ends of the three series AC_LED are electrically coupling to metal contacts P7~P9 respectively. The metal contacts P7~P9 are then coupled to a three-phase voltage power source.

Figure 11:
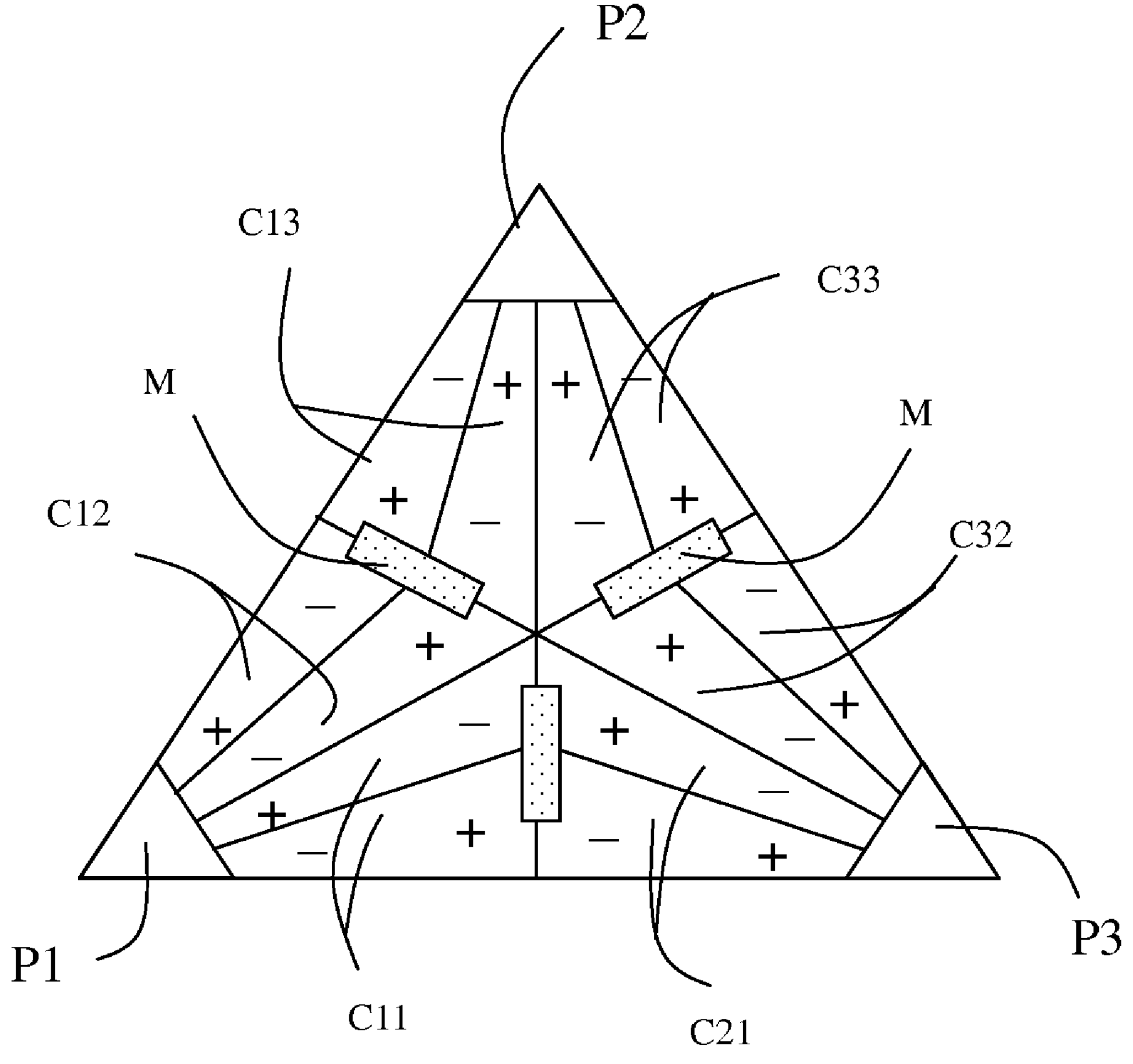
FIG. 11. is a schematic view showing a fourth embodiment of the present invention.

FIG. 11 is a schematic view showing is a fourth embodiment of the present invention. FIG. 11 discloses an embodiment that simplifies the design and connection between AC_LED units and its components of a pair of DC_LED units. FIG. 11 shows there are three metal contacts for coupling to three-phase voltage power, the components AC_LED locates in between every two metal contacts, the corresponding circuitry is as shown in FIG. 6. Like numeral corresponding to the same element in both FIG. 6 and FIG. 11. Each AC_LED units is composed of two DC_LED units. The AC_LED units is arranged to have a relative relationship just the same as that shown in FIG. 6. In other words, the AC_LED units are arranged with area division in between metal contacts. There are three metal contacts P1~P3, in between metal contact P1 and P2, a pair of DC_LED units form an AC_LED unit C12, similarly, a pair of DC_LED units form an AC_LED13 unit. AC_LED unit C12 has a first end coupling to metal contact P1, and has a second end coupling to a first end of AC_LED unit C13 through metal line M. AC_LED unit C13 has a second end coupling to metal contact P2.

Similarly, the detailed description for the AC_LED units C33 and C32 in between metal contacts P2 and P3, and the detailed description for the AC_LED units C21 and C11 in between metal contacts P3 and P1 are omitted here.

Figure 12:
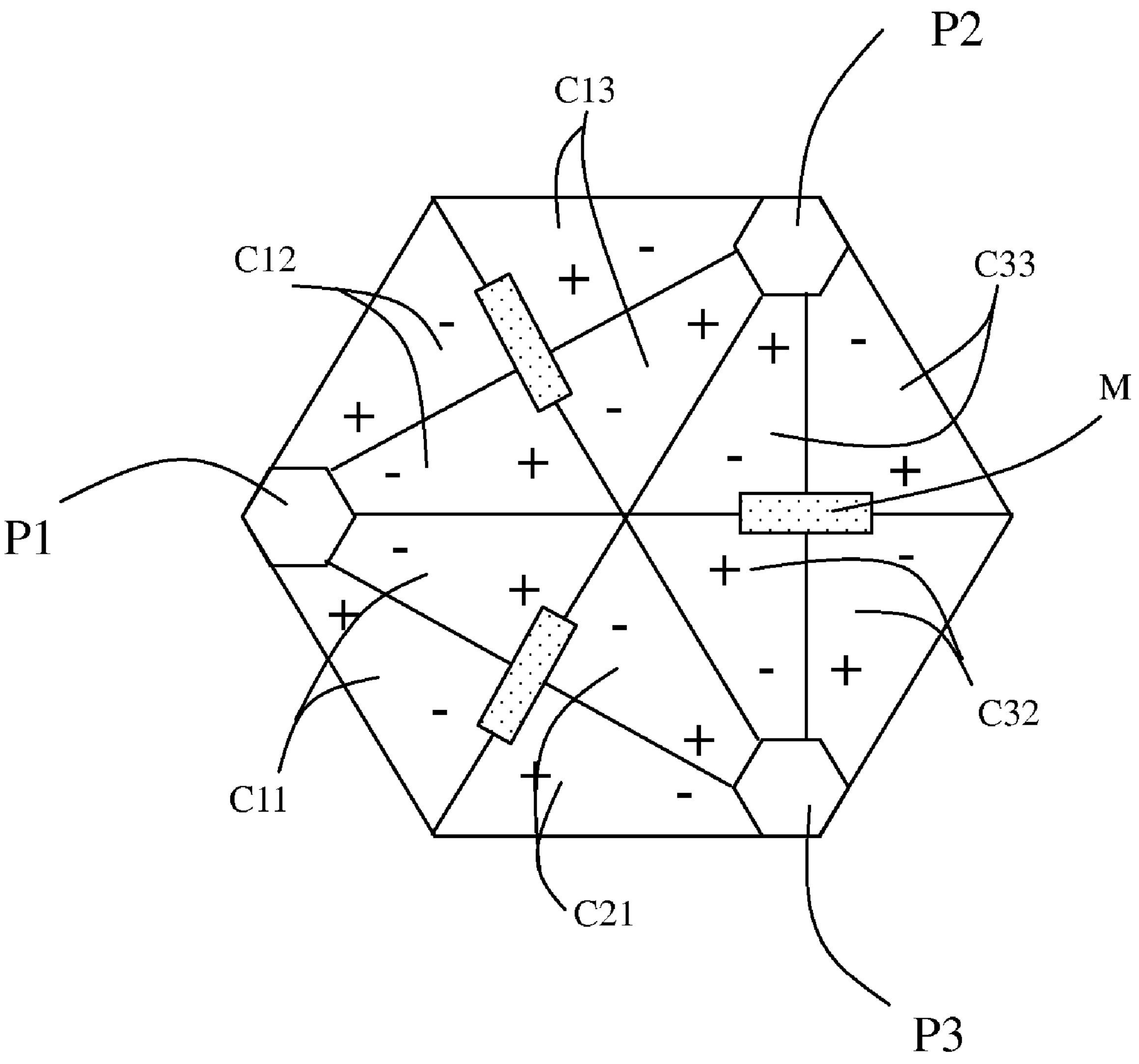
FIG. 12. is a schematic view showing a fifth embodiment of the present invention.
Figure 13:
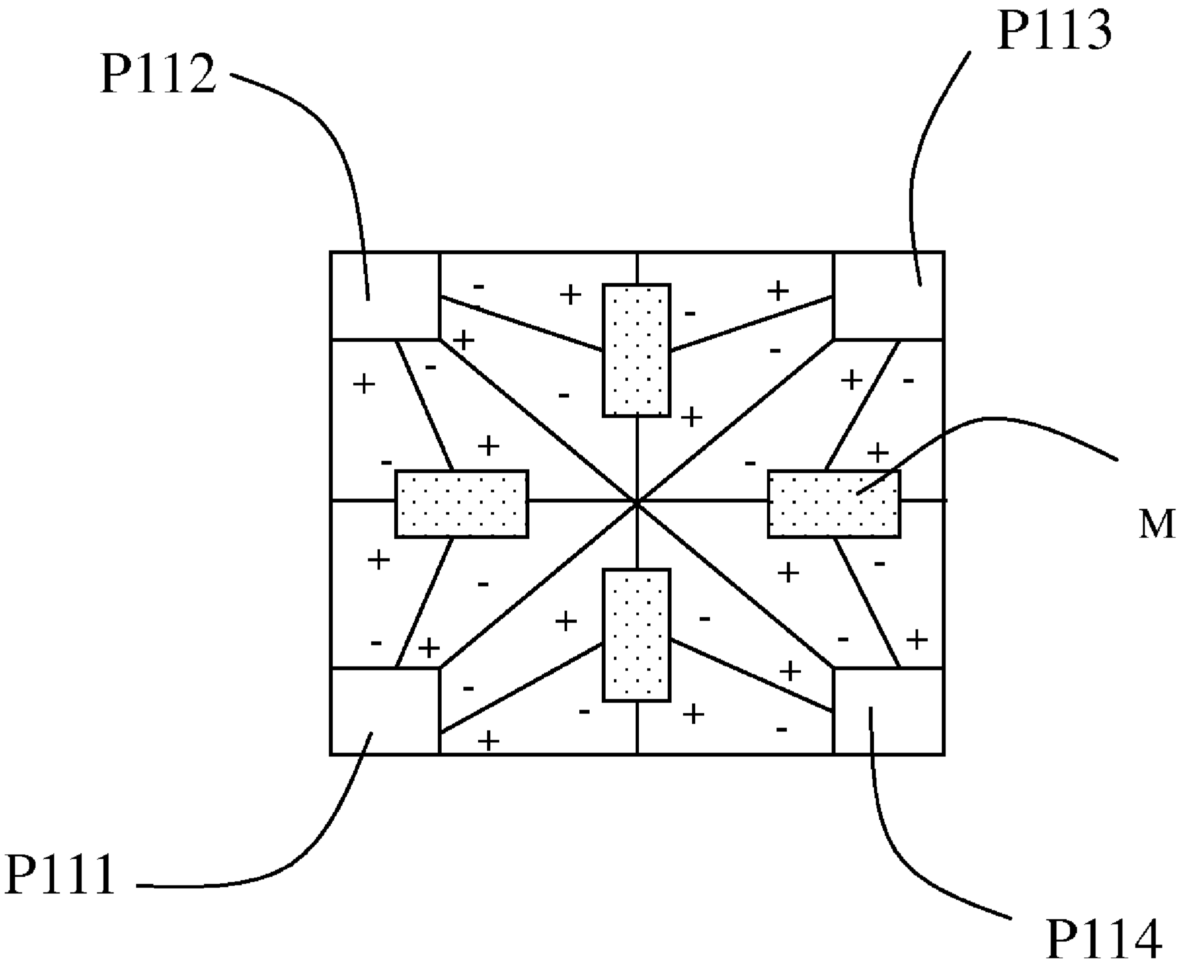
FIG. 13. is a schematic view showing a sixth embodiment of the present invention.

FIG. 12. is a schematic view showing a fifth embodiment of the present invention. FIG. 12 is a transformation of the outline to the AC_LED units. Different outline displays different light emission efficiency. The principle is exactly the same as that in FIG. 11. Detailed description for the arrangement of AC_LED units in between metal contacts is omitted here. The key point is that all the AC_LED units are area division in between metal contacts that fully utilizes the surface of the chip area to the maxima. Referring to FIG. 13, which is a schematic view showing a sixth embodiment of the present invention comprising a single-chip design of an AC_LED light unit with four metal contacts. The four metal contacts P111~P114 locates in the four corners of the rectangle AC_LED unit single chip. The AC_LED units are area division in between metal contacts that simplifies the design and utilizes the chip area to the maxima. Detailed description for the arrangement of AC_LED units in between metal contacts is omitted here.

Figure 14:
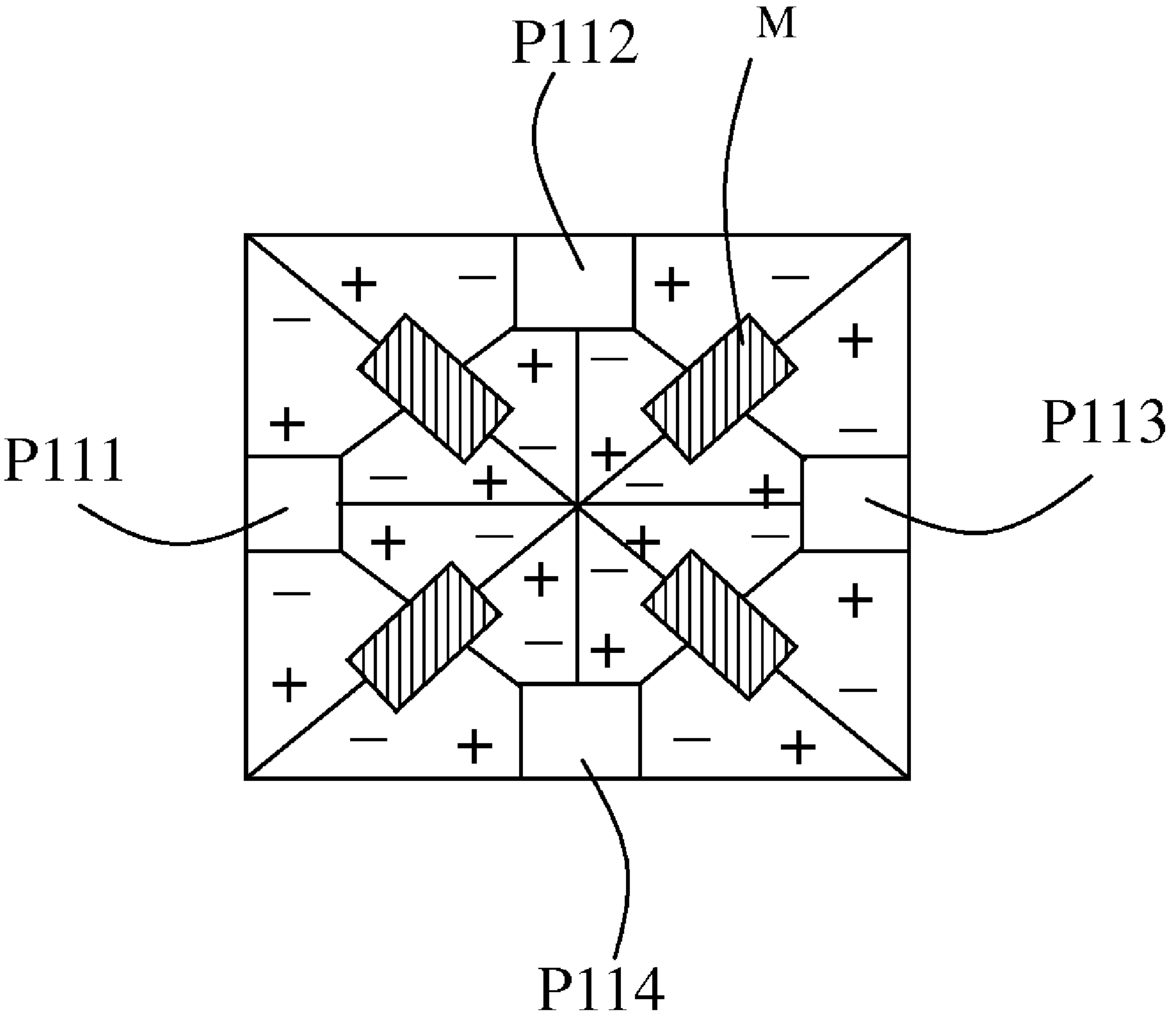
FIG. 14. is a schematic view showing a seventh embodiment of the present invention.

Referring to FIG. 14, which is a schematic view showing a seventh embodiment of the present invention. FIG. 14 is a different layout but substantial equivalent to that shown in FIG. 13. Different layout displays different light emission efficiency. The principle is exactly the same as that in FIG. 13.

Detailed description for the arrangement of AC_LED units in between metal contacts is omitted here. The key point is that all the AC_LED units are area division in between metal contacts.

Figure 15:
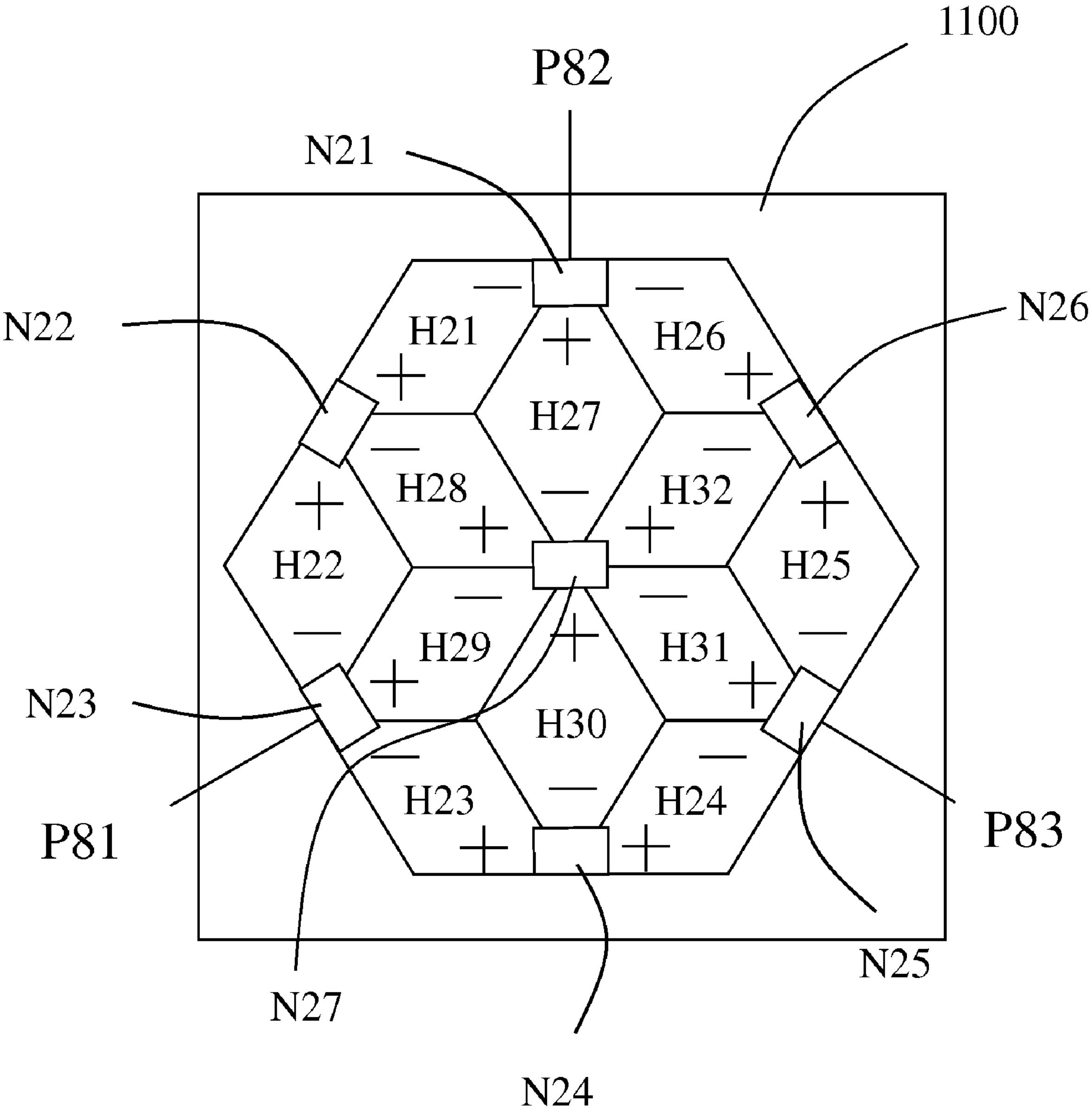
FIG. 15. is a schematic view showing a eighth embodiment of the present invention.

Referring to FIG. 15, which is a schematic view showing an eighth embodiment of the present invention, an AC_LED system in a single chip with three metal contacts or pads composed of twelve DC_LED units is disclosed. Twelve DC_LED units H21~H32 are disposed neighboring on a same substrate 1100. FIG. 15 shows an rhombic outline for each of the DC_LED units, and a hexagon for the whole chip. The rhombic and the hexagon is the best mode as an example but not a limitation, a slight modification in the outline can be made and still within the scope of this patent application to which the applicant intents to protect. FIG. 15 shows the structure as follows:

(1) seven metal contacts N21, N22, N23, N24, N25, N26, N27, each coupling neighboring electrodes of neighboring DC_LED units;

(2) the positive electrode of a first DC_LED unit H21, the negative electrode of an eighth DC_LED unit H28, and the positive electrode of a second DC_LED unit H22, being coupled to a second metal contact N22;

(3) the negative electrode of the second DC_LED unit H22, the positive electrode of an ninth DC_LED unit H29, and the negative electrode of a third DC_LED unit H23, being coupled to a third metal contact N23;

(4) the positive electrode of the third DC_LED unit H23, the negative electrode of a tenth DC_LED unit H30, and the positive electrode of a fourth DC_LED unit H24, being coupled to a fourth metal contact N24;

(5) the negative electrode of the fourth DC_LED unit H24, the positive electrode of an eleventh DC_LED unit H31, and the negative electrode of a fifth DC_LED unit H25, being coupled to a fifth metal contact N25;

(6) the positive electrode of the fifth DC_LED unit H25, the negative electrode of a twelfth DC_LED unit H32, and the positive electrode of a sixth DC_LED unit H26, being coupled to a sixth metal contact N26;

(7) the negative electrode of the sixth DC_LED unit H26, the positive electrode of a seventh DC_LED unit H27, and the negative electrode of the first DC_LED unit H21, being coupled to a first metal contact N21; and (8) the negative electrode of the seventh DC_LED unit H27, the positive electrode of the eighth DC_LED unit H28, and the negative electrode of the ninth DC_LED unit H29, the positive electrode of the tenth DC_LED unit H30, and the negative electrode of the eleventh DC_LED unit H31, the positive electrode of the twelfth DC_LED unit H32, being coupled to a seven metal contact N27. The three metal contacts N21, N23, and N25 are then coupled to a three-phase voltage power source through power lines P82, P81 and P83 respectively.

Figure 16:
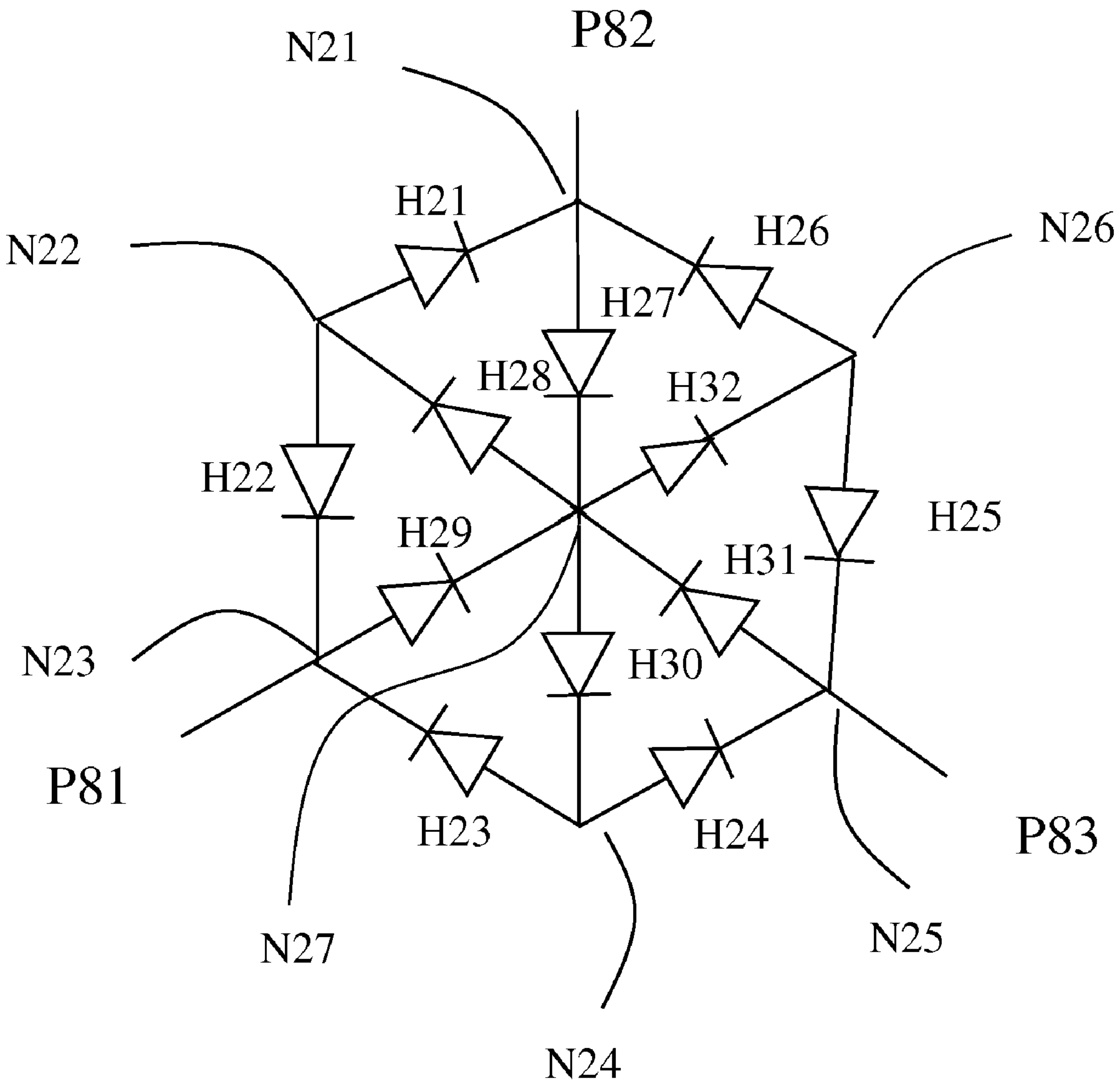
FIG. 16 is a schematic view showing an equivalent circuitry of FIG. 15.

Referring to FIG. 16, which is a schematic view showing an equivalent circuitry of FIG. 15, the twelve DC_LED units H21~H32 in FIG. 16 are corresponding to those in FIG. 15 respectively. The metal contacts N21~N27 corresponds to the metal contacts in FIG. 15 respectively. The hexagon circuitry is composed of twelve DC_LED units. FIG. 16 shows the relationship among the twelve DC_LED units that forms an AC_LED with three metal contacts. The hexagon circuitry comprises:

(1) a first metal contact N21, a second metal contact N22, a third metal contact N23, a fourth metal contact N24, a fifth metal contact N25, a sixth metal contact N26, and a seventh metal contact N27;

(2) a first DC_LED H21, electrically coupling from metal contact N21 in backward direction to metal contact N22;

(3) a second DC_LED H22, electrically coupling from metal contact N22 in forward direction to metal contact N23;

(4) a third DC_LED H23, electrically coupling from metal contact N23 in backward direction to metal contact N24;

(5) a fourth DC_LED H24, electrically coupling from metal contact N24 in forward direction to metal contact N25;

(6) a fifth DC_LED H25, electrically coupling from metal contact N25 in backward direction to metal contact N26;

(7) a sixth DC_LED H26, electrically coupling from metal contact N26 in forward direction to metal contact N21;

(8) a seventh DC_LED H27, electrically coupling from metal contact N27 in backward direction to metal contact N21;

(9) an eighth diode D28, electrically coupling from metal contact N27 in forward direction to metal contact N22;

(10) a ninth DC_LED H29, electrically coupling from metal contact N27 in backward direction to metal contact N23;

(11) a tenth DC_LED H30, electrically coupling from metal contact N27 in forward direction to metal contact N24;

(12) an eleventh DC_LED [[H23]] H31, electrically coupling from metal contact N27 in backward direction to metal contact N25;

(13) a twelfth DC_LED 1132, electrically coupling from metal contact N27 in forward direction to metal contact N26; and

(14) metal contacts N21, N23 and N25 couples to a three-phase voltage power source through metal line P82, P81 and P83 respectively.

The current paths from metal contact N21 to metal contact N23 are H27-H30-H23 and H27-H28-H22.

The current paths from metal contact N21 to metal contact N25 are H27-H30-H24 and H27-H32-H25.

The current paths from metal contact N23 to metal contact N21 are H29-H32-H26 and H29-H28-H21.

The current paths from metal contact N23 to metal contact N25 are H29-H32-H25 and H29-H30-H24.

The current paths from metal contact N25 to metal contact N21 are H31-H32-H26 and H31-H28-H21.

The current paths from metal contact N25 to metal contact N23 are H31-H28-H22 and H31-H30-H23.

The current paths from node N25 to node N23 are H31-H28-H22 and H31-H30-H23.

The embodiments shown in the present invention disclosure disclose a shortest electrical coupling between diodes on the same surface, alternatively conventional three dimension interconnection with an additional insulation layer and deposited metal lines can be use to replace the shortest surface coupling circuitry.

While the preferred embodiments have been described by way of example, it will be apparent to those skilled in the art that various modification may be made in the embodiments without departing from the spirit of the present invention. Such modifications are all within the scope of the present invention, as defined by the appended claims.

What is claimed is:

1. A LED system in a single chip with three metal contacts, comprising:

first, second, and third metal contacts disposed on a substrate;

a plurality of LED units disposed on the substrate, comprising a first series of LED units having a first end coupled to the first metal contact and a second end coupled to the second metal contact, a second series of LED units having a first end coupled to the first metal contact and a second end coupled to the third metal contact, and a third series of LED units having a first end coupled to the second metal contact and a second end coupled to the third metal contact;

wherein any two of the three series of LED units are not parallel with each other.

2. The LED system in a single chip as claimed in claim 1, wherein each of the metal contacts is a metal pad.

3. The LED system in a single chip as claimed in claim 1, wherein the LED units are disposed with area division between the metal contacts.

4. An AC_LED system in a single chip comprising twelve DC_LED units on a same substrate, comprising:

seven metal contacts each coupled to neighboring electrodes of neighboring DC_LED units;

a positive electrode of a first DC_LED, a negative electrode of an eighth DC_LED, and a positive electrode of a second DC_LED, being coupled to a second metal contact;

a negative electrode of the second DC_LED, a positive electrode of an ninth DC_LED, and a negative electrode of a third DC_LED, being coupled to a third metal contact;

a positive electrode of the third DC_LED, a negative electrode of a tenth DC_LED, and a positive electrode of a fourth DC_LED, being coupled to a fourth metal contact;

a negative electrode of the fourth DC_LED, a positive electrode of an eleventh DC_LED, and a negative electrode of a fifth DC_LED, being coupled to a fifth metal contact;

a positive electrode of the fifth DC_LED, a negative electrode of a twelfth DC_LED, and a positive electrode of a sixth DC_LED, being coupled to a sixth metal contact;

a negative electrode of the sixth DC_LED, a positive electrode of an seventh DC_LED, and a negative electrode of the first DC_LED, being coupled to a first metal contact; and a negative electrode of the seventh DC_LED, a positive electrode of the eighth DC_LED, and a negative electrode of the ninth DC_LED, a positive electrode of the tenth DC_LED, and a negative electrode of the eleventh DC_LED, a positive electrode of the twelfth DC_LED, being coupled to a seventh metal contact.

5. The AC_LED system in a single chip as claimed in claim 4, wherein each of the metal contacts is a metal pad.

* * * * *